(12) United States Patent
Flachowsky et al.

(10) Patent No.: US 8,872,272 B2
(45) Date of Patent: Oct. 28, 2014

(54) STRESS ENHANCED CMOS CIRCUITS AND METHODS FOR THEIR MANUFACTURE

(75) Inventors: Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/545,624

(22) Filed: Jul. 10, 2012

(65) Prior Publication Data

US 2014/0015060 A1    Jan. 16, 2014

(51) Int. Cl.
*H01L 21/31*    (2006.01)
*H01L 27/092*    (2006.01)

(52) U.S. Cl.
USPC .... 257/369; 257/390; 257/401; 257/E27.062; 257/E21.24

(58) Field of Classification Search
USPC .......... 257/204, 231–390, E27.062–E27.067, 257/E27.108
See application file for complete search history.

(56) References Cited

U.S. PATENT DOCUMENTS

| | | | |
|---|---|---|---|
| 2008/0157223 A1* | 7/2008 | Teo et al. | 257/401 |
| 2009/0121261 A1* | 5/2009 | Doris et al. | 257/288 |
| 2011/0175169 A1* | 7/2011 | Cheng et al. | 257/369 |

* cited by examiner

*Primary Examiner* — Mamadou Diallo
(74) *Attorney, Agent, or Firm* — Ingrassia Fisher & Lorenz, P.C.

(57) ABSTRACT

A method for fabricating a stress enhanced CMOS circuit includes forming a first plurality of MOS transistors at a first pitch and forming a second plurality of MOS transistors at a second pitch. The second pitch is larger than the first pitch. The method further includes depositing a single stress liner overlying the first and second plurality of MOS transistors. The single stress liner is the only stress liner deposited in the fabrication of the stress enhanced CMOS circuit. A stress enhanced CMOS circuit includes a first plurality of MOS transistors formed at a first pitch and a second plurality of MOS transistors formed at a second pitch. The second pitch is larger than the first pitch. The circuit further includes a single stress liner overlying the first and second plurality of MOS transistors. The single stress liner is the only stress liner formed on the stress enhanced CMOS circuit.

12 Claims, 3 Drawing Sheets

STRESS ENHANCED CMOS CIRCUITS AND METHODS FOR THEIR MANUFACTURE

TECHNICAL FIELD

The present invention generally relates to CMOS circuits and methods for their manufacture, and more particularly the present disclosure relates to stress enhanced CMOS circuits with a single stress liner and methods for their manufacture.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The gain of an MOS transistor, usually defined by the transconductance ($g_m$), is proportional to the mobility ($\mu$) of the majority carrier in the transistor channel. The current carrying capability and hence the performance of an MOS transistor is proportional to the mobility of the majority carrier in the channel. The mobility of holes, the majority carrier in a P-channel MOS (PMOS) transistor, and the mobility of electrons, the majority carrier in an N-channel MOS (NMOS) transistor, can be enhanced by applying an appropriate stress to the channel. The known stress engineering methods greatly enhance circuit performance by increasing device drive current without increasing device size and device capacitance. It is known, for example, that a tensile stress liner applied to an NMOS transistor induces a longitudinal stress in the channel and enhances the majority carrier electron mobility, but a tensile stress liner applied to a PMOS transistor results in a decrease in majority carrier hole mobility. Similarly, a compressive stress liner applied to a PMOS transistor induces a compressive stress in the channel and enhances the hole mobility, but if applied to an NMOS transistor the compressive stress liner decreases majority carrier electron mobility.

Various approaches for introducing a stress in a CMOS circuit are known in the art, but suffer from certain drawbacks. In one example, a first tensile stress liner material is deposited over the CMOS circuit, and is subsequently removed from the PMOS using a mask and etch step. Thereafter, a second compressive stress liner material is deposited over the CMOS circuit, and is subsequently removed from the NMOS using another mask and etch step. However, the requirement of multiple material deposition steps, followed by multiple masking and etching steps, increases the overall fabrication cycle time and significantly increases the fabrication cost of the circuit. In another example, embedded SiGe source/drain regions may be fabricated in the circuit in order to compress the channel of the PMOS. However, SiGe is not suitable for use in NMOS circuits, and there is no currently known process scheme that is commercially viable to introduce the same effect in an NMOS circuit. In yet another example, a single stress liner material is deposited over the CMOS circuit, and then the stress over either the NMOS or the PMOS (depending on what type of liner was deposited) is relaxed using an ion implantation step. However, this approach requires a masking step and an implantation step that both need to be highly optimized in order avoid damage the transistor below the stress liner.

Accordingly, it is desirable to provide improved stress enhanced CMOS circuits and methods for their manufacture. Furthermore, other desirable features and characteristics of the present disclosure will become apparent from the subsequent detailed description and the appended claims, taken in conjunction with the accompanying drawings and the foregoing technical field and background.

BRIEF SUMMARY

Stress enhanced CMOS circuits and methods for their manufacture are disclosed herein. In one exemplary embodiment, a method for fabricating a stress enhanced CMOS circuit includes forming a first plurality of MOS transistors at a first pitch and forming a second plurality of MOS transistors at a second pitch. The second pitch is larger than the first pitch. The method further includes depositing a single stress liner overlying the first and second plurality of MOS transistors. The single stress liner is the only stress liner deposited in the fabrication of the stress enhanced CMOS circuit.

In another exemplary embodiment, a stress enhanced CMOS circuit includes a first plurality of MOS transistors formed at a first pitch and a second plurality of MOS transistors formed at a second pitch. The second pitch is larger than the first pitch. The circuit further includes a single stress liner overlying the first and second plurality of MOS transistors. The single stress liner is the only stress liner formed on the stress enhanced CMOS circuit.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The present disclosure provides a stress-enhanced CMOS integrated circuit with only a single stress-inducing layer, either tensile or compressive, provided over all of the transistors in the integrated circuit, both NFET and PFET, that does not suffer significant performance degradation at either the NFET or PFET. More specifically, the present disclosure provides a stress-enhanced CMOS integrated circuit that allows for a layer of compressive stress material to be deposited over NFETs or a tensile stress material to be deposited over PFETs without significantly degrading the electron mobility in NFETs or the hole mobility in PFETs.

Figure 1A:
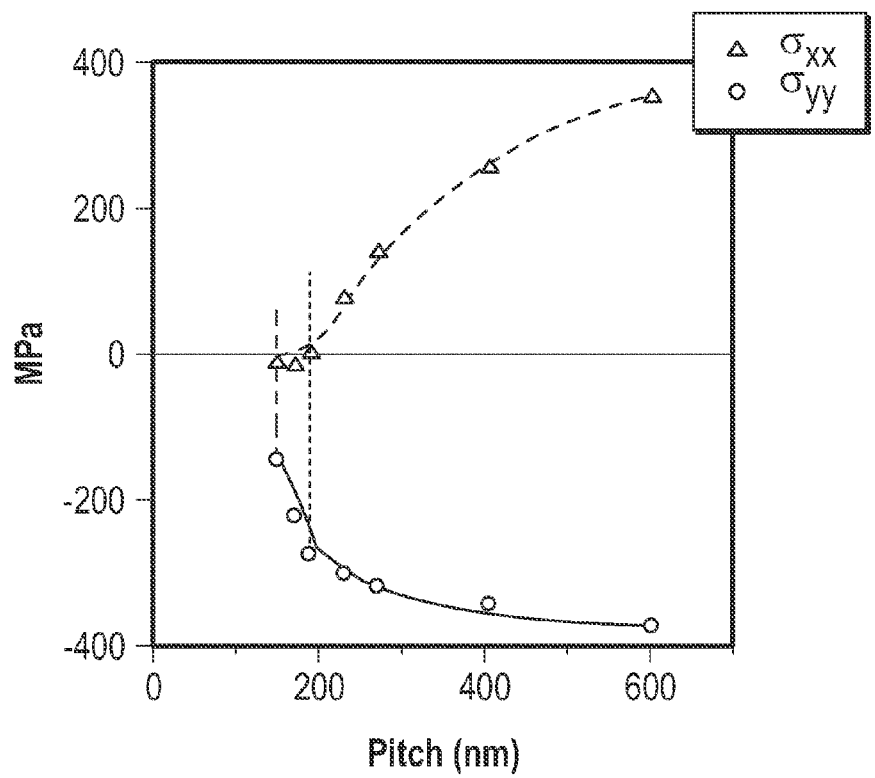
FIG. 1a depicts a plot that illustrate the relationship between stress and pitch in an exemplary CMOS circuit.

FIG. 1a depicts a graph that shows the relationship between stress induced in a transistor by the application of a stress-enhancing over-layer and the pitch of the transistors in the integrated circuit. As is well-known in the art, the term "pitch" refers to the center-to-center distance between features of an integrated circuit, such as NFETs and PFETs. In FIG. 1a, the stress-enhancing over-layer that has been applied is a tensile stress material. The vertical axis illustrates the increase or decrease in stress in terms of MPa (megapascals), while the horizontal axis illustrates the pitch of the integrated circuit in nm (nanometers). While both the effect on longitudinal stress $\sigma_{xx}$ and lateral stress $\sigma_{yy}$ by the pitch of the integrated circuit are depicted, it will be appreciated that lateral stress plays the most significant factor in mobility (electron or hole) due to the alignment of the source and the drain in an integrated circuit. As shown in FIG. 1a, it can be seen that, at about 160 nm pitch (indicated by long-dash vertical line), $\sigma_{yy}$ is reduced by about 130 MPa. Further, at about 190 nm pitch (indicated by short-dash vertical line), $\sigma_{yy}$ is reduced by about 280 MPa. As pitch is increased, the reduction in stress is diminished for each additional nm, as shown by the curvature of the plot in part (a). For example, at about 600 nm of pitch, $\sigma_{yy}$ is only reduced by about 380 MPa.

Figure 1B:
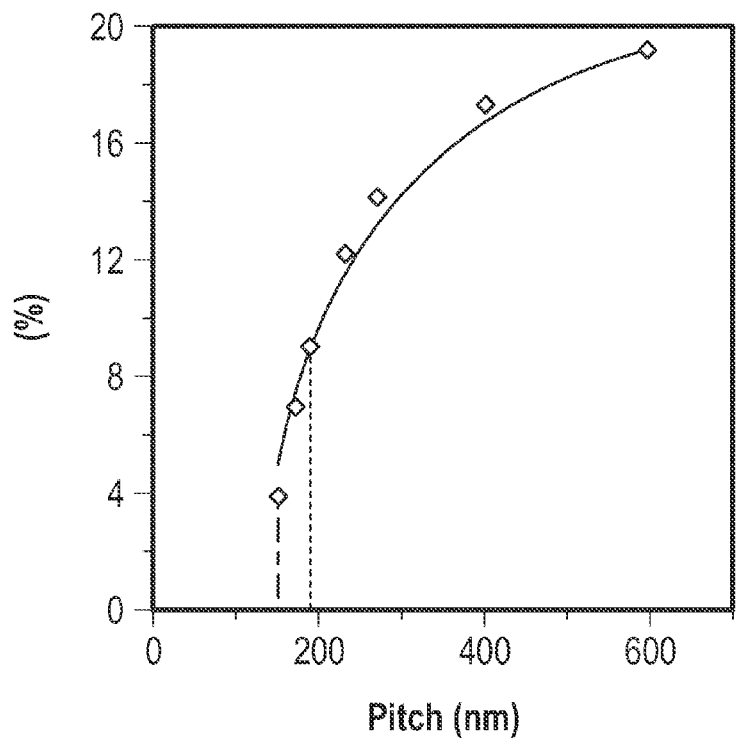
FIG. 1b depicts a plot that illustrate the relationship between stress and electron mobility in an exemplary CMOS circuit.

FIG. 1b depicts a graph that shows the percentage change in electron mobility, as compared to an unstressed transistor. Here again, the examples of a 160 nm pitch device and a 190 nm pitch device are used for purposes of illustration. At 160 nm of pitch, the electron mobility is increased only by about 4%. Whereas, at 190 nm of pitch, the electron mobility is increased by about 9%. This change corresponds roughly with the changes in stress noted above with regard to FIG. 1a. Thus, if one or more PFETs were implemented on an integrated circuit at a pitch of 160 nm, as indicated by the long-dash vertical line in the figures, and if one or more NFETs were implemented on the integrate circuit at a pitch of 190 nm, the NFETs would see a performance improvement with regard to an electron mobility increase of about 9%, whereas the PFETs would only suffer a small performance degradation of about a 4% increase in electron mobility.

As such, with regard to the application of a single layer of a tensile stress-inducing material, it will be appreciated that performance of the NFETs can be significantly increased by using relatively larger pitches, whereas degradation in performance of the PFETs can be minimized by using relatively smaller pitches. In alternative embodiments wherein a compressive stress-inducing material is desired, it will therefore be appreciated that performance of the PFETs can be significantly increased by using relatively larger pitches (corresponding to a relatively larger increase in $\sigma_{yy}$, and thus a relatively larger increase in hole mobility), whereas degradation in performance of the NFETs can be minimized be using relatively smaller pitches (corresponding to a relatively smaller increase in $\sigma_{yy}$, and thus a relatively smaller increase hole mobility).

In accordance with the foregoing, a method for manufacturing a stress-enhanced CMOS integrated circuit is provided herein. The stress-enhanced CMOS circuit may include a plurality of stress enhanced NMOS and/or PMOS transistors with or without conventional MOS transistors coupled together to implement a desired integrated circuit. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2:
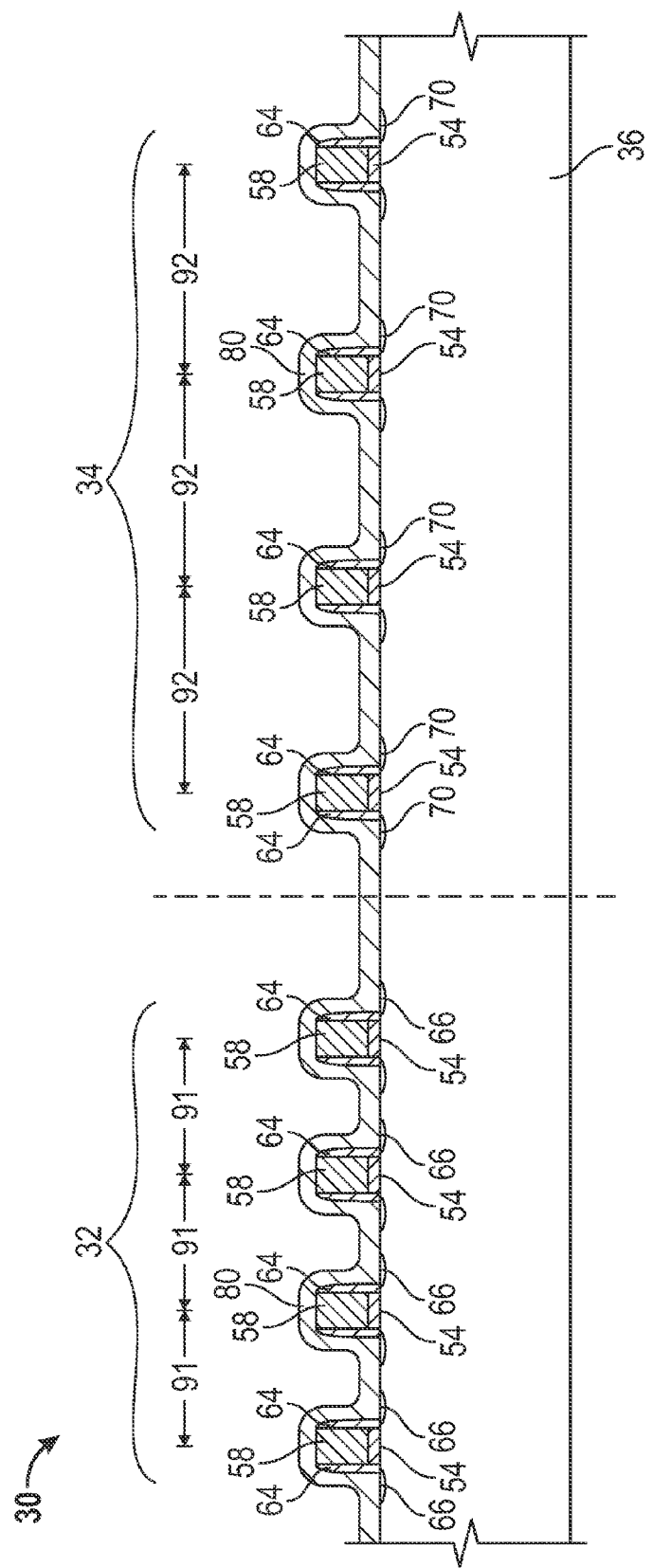
FIG. 2 illustrates, in cross section, an exemplary stress-enhanced CMOS circuit in accordance with one embodiment of the present disclosure.

As illustrated in cross section in FIG. 2, the manufacture of stress enhanced CMOS circuit 30 in accordance with an embodiment of the invention begins with providing a semiconductor substrate 36 in and on which stress enhanced MOS transistors 32 and 34 are fabricated. In FIG. 2, as will be discussed in greater detail below, MOS transistors 32 are PFETs and MOS transistors 34 are NFETs. The initial steps in the fabrication of MOS circuit 30 are conventional and will not be described in detail. The semiconductor substrate is preferably a silicon substrate having a (100) surface crystal orientation wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. Semiconductor substrate 36 will hereinafter be referred to for convenience but without limitation as a silicon substrate although those of skill in the semiconductor art will appreciate that other semiconductor materials could be used. Silicon substrate 36 may be a bulk silicon wafer (not illustrated), or may be a thin layer of silicon on an insulating layer (commonly know as silicon-on-insulator or SOI) that, in turn, is supported by a carrier wafer. In the example of a SOI substrate, the thin silicon layer typically has a thickness of less than about 100 nanometers (nm) depending on the circuit function being implemented, and in certain applications preferably has a thickness of about 20 nm or less. The thin silicon layer preferably has a resistivity of at least about 1-35 Ohms per square. The silicon can be impurity doped either N-type or P-type, but is preferably doped P-type. The insulating layer, typically silicon dioxide, preferably has a thickness of about 50-200 nm.

In some embodiments, isolation regions can be formed that extend through substrate 36 to the insulating layer (not illustrated in FIG. 2). The isolation regions are preferably formed by well known shallow trench isolation (STI) techniques in which trenches are etched into silicon substrate 36, the trenches are filled with a dielectric material such as deposited silicon dioxide, and the excess silicon dioxide is removed by chemical mechanical planarization (CMP). STI regions provide electrical isolation, as needed, between various devices of the CMOS circuit that are to be formed. Although STI regions are initially filled with a dielectric material such as silicon dioxide, especially for devices formed in very thin (less than 20 nm) silicon layers, much of that dielectric material may be removed as a consequence of the many etching steps that occur throughout the fabrication process. After fabrication of the STI regions, selected portions of substrate 36 can be impurity doped, for example by ion implantation.

A layer of gate insulator is formed on surface silicon substrate 36. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited in known manner, for example, by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 1-10 nm in thickness. In accordance with one embodiment of the invention a layer of gate electrode forming material, preferably polycrystalline silicon, is deposited onto the layer of gate insulator. Other electrically conductive gate electrode forming materials such as metals and metal silicides may also be deposited providing the material by itself or with appropriate impurity doping can set the necessary threshold voltage of the transistor. The gate electrode forming material will hereinafter be referred to as polycrystalline silicon although those of skill in the art will recognize that other materials can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation.

The polycrystalline silicon gate electrode forming material is patterned and etched to form gate electrodes 58. Patterning and etching includes the step of depositing a patterned photoresist layer and etching according to the pattern. Patterning and etching also forms gate insulators 54 below the electrode from the layer of gate insulating material previously deposited.

The fabrication method continues in conventional manner by the formation of side wall spacers 64 on the side walls of gate electrodes 58. The side wall spacers can be formed, for example, by depositing a layer of side wall spacer material such as silicon nitride, silicon oxide, or other dielectric material and anisotropically etching that layer, for example by reactive ion etching (RIE). The gate electrodes and side wall spacers are used as ion implantation masks and conductivity determining dopant ions are implanted into exposed portions of silicon substrate 36 to form source and drain regions 66 of PFET transistors 32 and source and drain regions 70 of NFET transistors 34. The source and drain regions of PFET transistors 32 can be formed by the implantation of boron ions and the source and drain regions of NFET transistors 34 can be formed by the implantation of arsenic or phosphorous ions as is well known. As is also well known, the PFET transistors can be masked, for example by a layer of patterned photoresist (not illustrated) during the implantation of the NFET transistors, and the NFET transistors can be similarly masked during the implantation of the PFET transistors. Although only one set of side wall spacers and one source/drain implantation have been illustrated for each transistor, those of skill in the art will recognize that additional spacers and implantations can be used to form halo implants and drain extensions, set threshold voltage, and the like.

After exposing the surface of the source and drain regions, a layer of silicide forming metal (not illustrated) such as nickel, cobalt, or the like is deposited. The silicide forming metal is heated, for example by rapid thermal annealing (RTA) to react the silicide forming metal with exposed silicon to form metal silicide contacts on the source and drain regions 66 and 70 and on the gate electrodes 58. Metal that is not reacted, for example the metal in contact with the side wall spacers, can be removed by wet etching in a $H_2O_2/H_2SO_4$ or $HNO_3/HCl$ solution.

In accordance with an embodiment of the invention, as illustrated in FIG. 2, a layer of tensile stressed liner material 80 is deposited to overlie the gate electrodes 58, side wall spacers 64, and source/drain regions 66 and 70. The layer of tensile stressed liner material 80 can be any tensile stressed insulating material, and preferably is a layer of tensile stressed silicon nitride having a thickness of about 40-50 nm.

As illustrated in FIG. 2, PFETs 32 have been fabricated at a relatively smaller pitch 91 than the NFETs 34, which were fabricated at a relatively larger pitch 92. Using the example above from FIG. 1, PFETs 32 can be fabricated at a pitch 91 of about 160 nm, whereas NFETs 34 can be fabricated at a pitch 92 of about 190 nm. Of course, various other combinations of pitches are possible. The smaller pitched PFETs 32 are affected, in terms of induced stress, less than the larger pitched NFETs 34. As such, according to the relationship noted above between pitch and stress, the increase in electron mobility in PFETs 32 will be significantly less than the increase in electron mobility in NFETs 34. In this manner, a single layer of a tensile stress inducing liner 80 can be provided to enhance the overall performance of the CMOS 30.

Figure 3:
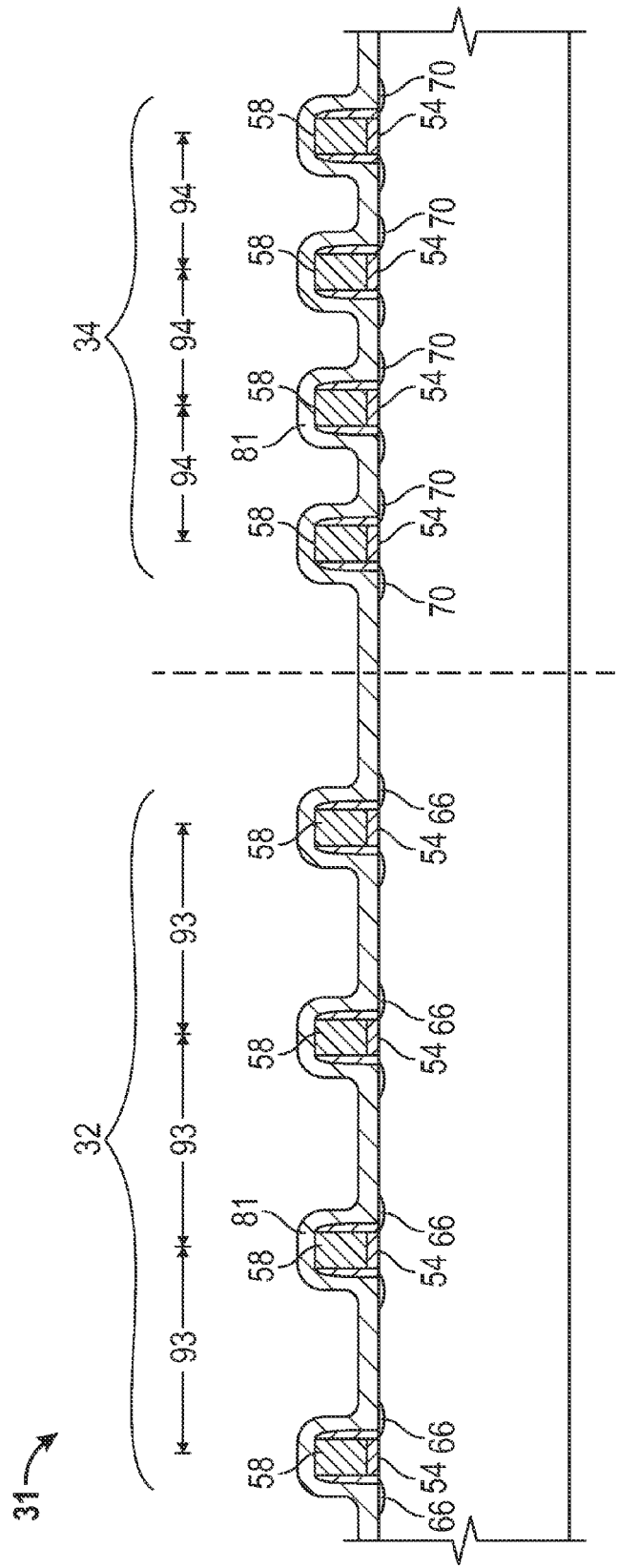
FIG. 3 illustrates, in cross section, an exemplary stress-enhanced CMOS circuit in accordance with another embodiment of the present disclosure.

In accordance with another embodiment of the present disclosure, as illustrated in FIG. 3, a layer of compressive stressed liner material 81 is deposited to overlie the gate electrodes 58, side wall spacers 64, and source/drain regions 66 and 70 of an integrated circuit 31. The layer of compressive stressed liner material 81 can be any compressive stressed insulating material, and preferably is a layer of compressive stressed silicon nitride having a thickness of about 40-50 nm. With regard to either the embodiment of FIG. 2 or FIG. 3, the layers of silicon nitride, both compressive stressed and tensile stressed, can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner.

As illustrated in FIG. 3, PFETs 32 have been fabricated at a relatively larger pitch 93 than the NFETs 34, which were fabricated at a relatively smaller pitch 94. Using the example above from FIG. 1, PFETs 32 can be fabricated at a pitch 93 of about 190 nm, whereas NFETs 34 can be fabricated at a pitch 94 of about 160 nm. Of course, various other combinations of pitches are possible. The larger pitched PFETs 32 are affected, in terms of induced stress, more than the smaller pitched NFETs 34. As such, according to the relationship noted above between pitch and stress, the increase in hole mobility in PFETs 32 will be significantly greater than the increase in hole mobility in NFETs 34. In this manner, a single layer of a compressive stress inducing liner 81 can be provided to enhance the overall performance of the CMOS 31.

Although not illustrated, stress enhanced MOS circuit 30 or 31 is completed in conventional manner by providing electrical contacts to the source and drain regions and to the gate electrodes. The conventional processing may include, for example, depositing interlayer dielectrics, etching contact vias, filling the contact vias with conductive plugs, and the like as are well known to those of skill in the art of fabricating semiconductor circuits.

The foregoing methods for fabricating stress enhanced MOS circuits can be combined with other methods for inducing mobility enhancing channel stress. For example, trenches etched in the silicon layer in the source and drain regions can be filled by the selective epitaxial growth of a material that has a different lattice constant than the lattice constant of the channel region. For example, the trenches of an NFET can be filled by the selective epitaxial growth of silicon mixed with up to about 3% carbon to enhance the longitudinal tensile stress in the channel. Similarly, the trenches of a PFET can be filled by the selective epitaxial growth of silicon admixed with up to about 30% germanium to enhance the longitudinal compressive stress in the channel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stress enhanced CMOS circuit comprising the steps of:
    forming a first plurality of MOS transistors at a first pitch, wherein forming the first plurality of MOS transistors comprises forming a first plurality of gate electrode structures and a first plurality of sidewall spacer structures disposed on vertical sidewalls of the first plurality of gate electrode structures;
    forming a second plurality of MOS transistors at a second pitch, wherein the second pitch is larger than the first pitch, wherein forming the second plurality of MOS transistors comprises forming a second plurality of gate electrode structures and a second plurality of sidewall spacer structures disposed on vertical sidewalls of the second plurality of gate electrode structures; and
    depositing a single stress liner overlying the first and second plurality of MOS transistors, including over the first plurality of gate electrode structures, the first plurality of sidewall spacer structures, the second plurality of gate electrode structures, and the second plurality of sidewall spacer structures, wherein the single stress liner is the only stress liner deposited in the fabrication of the stress enhanced CMOS circuit,
    wherein: the single stress liner is either a tensile stress liner or a compressive stress liner, and further wherein: if the single stress liner is a tensile stress liner, then the first plurality of MOS transistors are all p-type transistors and the second plurality of MOS transistors are all n-type transistors, and if the single stress liner is a compressive stress liner, then the first plurality of MOS transistors are all n-type transistors and the second plurality of MOS transistors are all p-type transistors.

2. The method of claim 1, wherein forming the tensile stress liner comprises forming a silicon nitride liner.

3. The method of claim 1, wherein forming the first plurality of MOS transistors at the first pitch comprises forming the first plurality of MOS transistors at a pitch of about 160 nm.

4. The method of claim 3, wherein forming the second plurality of MOS transistors at the second pitch comprises forming the second plurality of MOS transistors at a pitch of about 190 nm.

5. The method of claim 1, wherein forming the compressive stress liner comprises forming a silicon nitride liner.

6. The method of claim 1, wherein forming the first plurality of MOS transistors at the first pitch comprises forming the first plurality of MOS transistors at a pitch of about 160 nm.

7. The method of claim 6, wherein forming the second plurality of MOS transistors at the second pitch comprises forming the second plurality of MOS transistors at a pitch of about 190 nm.

8. The method of claim 1, further comprising forming a first plurality of electrical contacts through the single stress liner to the first plurality of gate electrode structures and forming a second plurality of electrical contacts through the single stress liner to the second plurality of gate electrode structures.

9. The method of claim 8, wherein both the first plurality of sidewall spacer structures and the second plurality of sidewall spacer structures are formed of a silicon nitride material.

10. A stress enhanced CMOS circuit, comprising:
    a first plurality of MOS transistors formed at a first pitch, wherein the first plurality of MOS transistors comprise a first plurality of gate electrode structures and a first plurality of sidewall spacer structures disposed on vertical sidewalls of the first plurality of gate electrode structures;
    a second plurality of MOS transistors formed at a second pitch, wherein the second pitch is larger than the first pitch, wherein the second plurality of MOS transistors comprise a second plurality of gate electrode structures and a second plurality of sidewall spacer structures disposed on vertical sidewalls of the second plurality of gate electrode structures; and
    a single stress liner overlying the first and second plurality of MOS transistors, including over the first plurality of gate electrode structures, the first plurality of sidewall spacer structures, the second plurality of gate electrode structures, and the second plurality of sidewall spacer structures, wherein the single stress liner is the only stress liner formed on the stress enhanced CMOS circuit,
    wherein: the single stress liner is either a tensile stress liner or a compressive stress liner, and further wherein: if the single stress liner is a tensile stress liner, then the first plurality of MOS transistors are all p-type transistors and the second plurality of MOS transistors are all n-type transistors, and if the single stress liner is a compressive stress liner, then the first plurality of MOS transistors are all n-type transistors and the second plurality of MOS transistors are all p-type transistors.

11. The circuit of claim 10, further comprising a first plurality of electrical contacts through the single stress liner to the first plurality of gate electrode structures and a second plurality of electrical contacts through the single stress liner to the second plurality of gate electrode structures.

12. The circuit of claim 11, wherein both the first plurality of sidewall spacer structures and the second plurality of sidewall spacer structures are formed of a silicon nitride material.

* * * * *